United States Patent [19]

Matsuura et al.

[11] 4,160,953
[45] Jul. 10, 1979

[54] SELF-OSCILLATION MIXER CIRCUITS

[75] Inventors: Shigeo Matsuura; Toshio Nagashima, both of Yokohama; Mitsuhisa Shinagawa, Fujisawa, all of Japan

[73] Assignee: Hitachi, Ltd., Tokyo, Japan

[21] Appl. No.: 885,978

[22] Filed: Mar. 13, 1978

[30] Foreign Application Priority Data

Mar. 11, 1977 [JP] Japan .................................. 52-25952
Mar. 11, 1977 [JP] Japan .................................. 52-25953

[51] Int. Cl.² .............................................. H04B 1/28
[52] U.S. Cl. .................................... 325/440; 325/443; 325/451; 331/58
[58] Field of Search ............... 325/443, 318, 440, 442, 325/449, 451, 491; 363/159, 163; 328/214; 331/58, 59

[56] References Cited

U.S. PATENT DOCUMENTS

| | | | |
|---|---|---|---|
| 2,582,683 | 1/1952 | Dammers | 325/440 |
| 2,775,705 | 12/1956 | Van Overbeek | 325/440 |
| 3,333,200 | 7/1967 | Wolfram | 325/440 |
| 3,694,756 | 9/1972 | Carlson | 325/451 |
| 4,056,787 | 11/1977 | Saitoh et al. | 325/440 |

FOREIGN PATENT DOCUMENTS

| | | | |
|---|---|---|---|
| 1591758 | 8/1970 | Fed. Rep. of Germany | 325/440 |
| 2522836 | 5/1975 | Fed. Rep. of Germany | 325/440 |

*Primary Examiner*—Robert L. Griffin
*Assistant Examiner*—Jin F. Ng
*Attorney, Agent, or Firm*—Craig and Antonelli

[57] ABSTRACT

A self-oscillation mixer circuit includes a cascade amplifier circuitry which is composed of a first transistor of a common emitter connection having a collector connected to an emitter of a second transistor of a common base connection, a filter circuitry for deriving an intermediate frequency signal and a resonance circuit adapted to resonate at a local oscillation frequency being connected to the collector of the second transistor and a feedback circuitry connected between the resonance circuitry and the emitter of the first transistor.

13 Claims, 11 Drawing Figures

SELF-OSCILLATION MIXER CIRCUITS

The present invention relates to a self-oscillation mixer circuit suited for use in a tuner for a television and a radio receiver.

The frequency converter circuit used in a superheterodyne receiver may be in general classified into a self-oscillation mixer circuit and a separate oscillation mixer circuit.

In FIG. 1, there is shown a typical example of a hitherto known self-oscillation mixer circuit of the base grounded type. This mixer circuit is composed of a mixer transistor 9, a high frequency input terminal 2, an intermediate frequency output terminal 4, a source voltage terminal 5, an intermediate frequency tuning coil 6, intermediate frequency tuning condensers 7 and 8, condenser 11 and coil 12 for determining a local oscillation frequency and a feedback condenser 13.

The high frequency signal to be frequency-converted is applied to the input terminal 2 and, after having been mixed and amplified by the transistor 9, only the intermediate frequency is derived from the terminal 4 through the intermediate frequency tuning circuit composed of the intermediate frequency tuning coil 6 and the intermediate frequency tuning capacitors 7 and 8. The local oscillation output required for the mixing operation is obtained from the transistor 9. In this manner, the self-oscillation mixer circuit shown in FIG. 1 is advantageous in respect of the number of required circuit components and manufacturing costs, because the local oscillation, mixing and amplification are attained by means of a circuit arrangement requiring only a single transistor. However, the hitherto known self-oscillation mixer circuit suffers from drawbacks in respect to the cross-modulation interference characteristics and the intermodulation interference characteristics in addition to a low conversion gain. In particular, a so-called six-channel color beat interference of color television receivers occurring in some areas in U.S.A. is caused by the degraded characteristics of the mixer circuit against the intermodulation interference. Thus, the hitherto known mixer circuit shown in FIG. 1 is rendered impracticable in the areas where the improved characteristics against the intermodulation interference are required.

As an attempt to improve the self-oscillation circuit shown in FIG. 1 in respect to the operation characteristics thereof, there has been already proposed a separate oscillation mixer circuit which is shown in FIG. 2, wherein like components as those shown in FIG. 1 are denoted by the same reference numerals. The mixer circuit shown in FIG. 2 further includes a first transistor 1 and a capacitor 10 having one end connected to a junction between the collector of the first transistor 1 and the emitter of the second transistor 9 and the other end grounded. The capacitor 10 serves for improving the intermodulation interference characteristic. The separate oscillation mixer circuit shown in FIG. 2 is of a so-called cascade circuit configuration in which the first transistor 1 is employed in a common base connection with the second transistor 9 in a common base connection while the collector of the former is connected in cascade to the emitter of the latter. This mixer circuit is improved over the self-oscillation mixer circuit shown in FIG. 1 in respect to the cross-modulation and intermodulation interference characteristics and additionally exhibits a high conversion gain. Specifically, the intermodulation interference characteristic of the mixer circuit shown in FIG. 2 can be significantly improved by selecting appropriately the capacitance of the capacitor 10. Further, by virtue of the high conversion gain, the mixer circuit shown in FIG. 2 can constitute a tuner having a sufficiently high gain in cooperation with a high frequency pre-amplifier which may have a low gain. Thus, the high frequency signal level input to the mixer circuit is allowed to be relatively low, in which in turn means that the cross-modulation interference characteristics as well as the intermodulation interference characteristics can be much more improved. In this manner, the circuit shown in FIG. 2 is certainly, excellent over the one shown in FIG. 1 in respect to the characteristics against the cross-modulation and the intermodulation interference. However, the separate oscillation mixer circuit shown in FIG. 2 cannot evade serious drawbacks such that an increased number of circuit components are required, involving expensiveness of the circuit implementation, because a separate local oscillator including at least one transistor together with associated bias circuit or the like therefor are required in addition to the mixer circuit, necessitating the use of at least three transistors in total for the combination of the mixer circuit ad the local oscillator.

An object of the invention is accordingly to provide a self-oscillation mixer circuit of a simplified circuit configuration requiring only a small number of transistors, which circuit is improved in respect to the cross-modulation interference characteristics and the intermodulation interference characteristics and provides additionally an increased conversion gain.

In view of the above and other objects which will become apparent as description proceeds, there is proposed according to a general aspect of the invention a self-oscillation mixer circuit in which the hitherto known self-oscillation mixer circuit including the single transistor is replaced by a cascade amplifier composed of two transistors, thereby to improve the cross-modulation interference characteristics as well as the intermodulation interference characteristics and at the same time enhance the conversion gain.

Other features and advantages of the invention will be apparent from the following description taken in connection with the accompanying drawings wherein.

Figure 1:
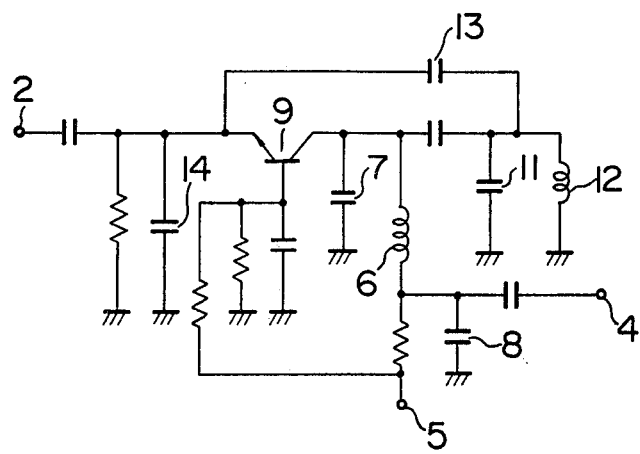
FIG. 1 is a circuit diagram of a hitherto known self-oscillation mixer circuit.
Figure 2:
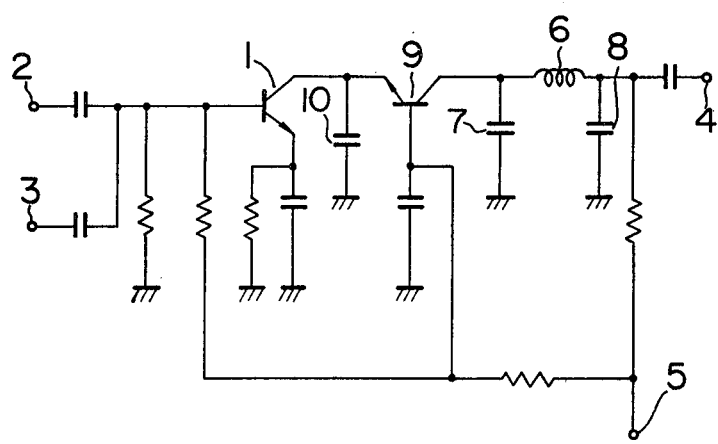
FIG. 2 is a circuit diagram showing a conventional separate oscillation mixer circuit of a cascade circuit configuration.
Figure 3:
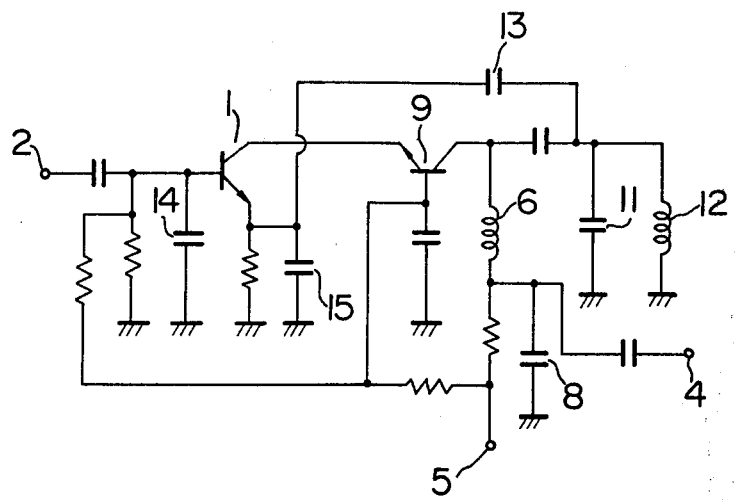
FIG. 3 is a circuit diagram showing a self-oscillation mixer circuit according to an embodiment of the invention.

FIG. 3 is a circuit diagram showing a first exemplary embodiment of the self-oscillation mixer circuit according to the invention. In the figure, circuit components or elements corresponding to those of the hitherto known mixer circuits shown in FIGS. 1 and 2 are denoted by same reference numerals. Specifically, reference numeral 11 denotes a resonance capacitor for determining a local oscillation frequency, and 12 denotes a resonance coil. A feedback capacitor 13 serves to bring about the local oscillation operation, while capacitors 14 and 15 serve to control appropriately the feedback quantity fed from the output side to the input side and establish properly the oscillating conditions. In the mixer circuit shown in FIG. 3, the transistors 1 and 9 serve for both the mixing operation and the local oscillation.

In the first place, description will be made on the local oscillation of the mixer circuit shown in FIG. 3. The local oscillation frequency is essentially determined by the resonance frequency of the resonance circuitry constituted by the resonance capacitor 11 and the resonance coil 12. The local oscillation circuitry will resonate at a predetermined resonance frequency component, resulting in generation of a high voltage at the resonance frequency across the local oscillation circuitry. This voltage is fed back to the emitter of the first transistor 1 through the feedback capacitor 13. The fed-back voltage is then amplified by the first and second transistors 1 and 9 and again supplied to the resonance circuitry constituted by the resonance capacitor 11 and the resonance coil 12 thereby to maintain the local oscillation.

Upon application of a high frequency signal at the input terminal 2, the high frequency signal is mixed with the local oscillation frequency component through the first and second transistors 1 and 9, whereby the resulting intermediate frequency signal is derived at the output terminal 4 after having been amplified by the transistors 1 and 9.

It will be thus appreciated that the first and the second transistors 1 and 9 serve not only for the mixing and amplifying operations but also take part in the local oscillation. Accordingly, no specific separate oscillation circuitry is required for the local oscillation, which in turn means that the number of the circuit components or elements is significantly decreased, leading to reduced manufacturing costs. Besides, since the high frequency signal input to the mixer circuit can be selected at a low level, the cross-modulation interference characteristic as well as the intermodulation interference characteristic can be improved with a high conversion gain being additionally obtained.

Referring again to FIG. 3, the feedback coupling to the emitter of the first transistor 1 through the feedback capacitor 13 is a positive feedback for satisfying the conditions for the local oscillation. The feedback quantity or ratio can be controlled by selecting correspondingly the capacitance values of the feedback capacitor 13 and the capacitor 15 connected to the emitter of the first transistor 1. When the feedback ratio or quantity is to be increased, the capacitance value of the capacitor 13 may be increased or alternatively that of the capacitor 15 may be decreased. In this connection, it should be however noted that an excessive decrease in the capacitance value of the capacitor 15 will incur a low conversion gain, because the capacitor 15 also functions to ground the emitter of the transistor 1 for the high frequency signal. It will be a matter of choice in design to select the values of the capacitors 13 and 15 in consideration of the operations described above. Further, in view of the fact that the capacitor 14 merely serve to set properly the conditions for the local oscillation, the capacitor 14 may be spared in dependence on the frequency range used in the self-oscillation mixer circuit or the variety of the circuit in the preceding stage connected to the mixer circuit.

The mixer circuit shown in FIG. 3 will assure a sufficiently high conversion gain for general applications. However, when higher conversion gain is to be obtained, this may be accomplished by connecting a trap circuitry tuned to the intermediate frequency between the base and the emitter of the first transistor 1 or alternatively between the base thereof and the ground. It should be mentioned that the trap circuitry be rather connected between the base and emitter of the first transistor 1 to more effectiveness in the case of the self-oscillation mixer circuit shown in FIG. 3 in which the capacitance of the capacitor connecting the emitter of the transmitter 1 to the ground may not be selected at a higher value as desired for the reason described above. An exemplary embodiment of the self-oscillation mixer circuit provided with such trap circuit is shown in FIG. 4.

Figure 4:
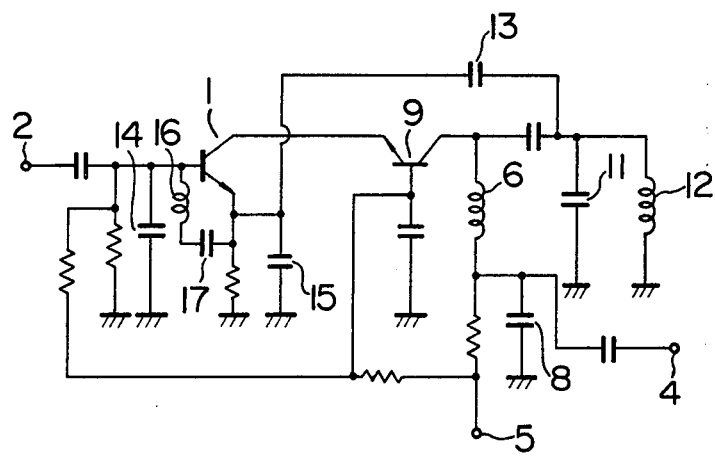
FIG. 4 is a circuit diagram showing another exemplary embodiment of the self-oscillation mixer circuit according to the invention.

Referring to FIG. 4, the trap circuitry is composed of an intermediate frequency trap coil 16 and a trap capacitor 17 and connected between the base and emitter of the first transistor 1. With this circuit configuration, there is provided for the intermediate frequency signal component produced between the base and emitter of the first transistor 1 a closed loop path extending from the emitter of the transistor 1 through the trap circuitry to the base and hence back to the emitter of the first transistor 1, whereby the intermediate frequency component flowing through the base-emitter junction of the first transistor will be increased as compared with the case in which such trap circuitry is absent. The advantages obtained due to the provision of the trap circuitry can be seen in that the intermediate frequency interference signal as fed to the high frequency input terminal 2 is prevented from being inputted to the inherent mixer circuit in addition to that the conversion gain may be increased as described hereinbefore.

Figure 5:
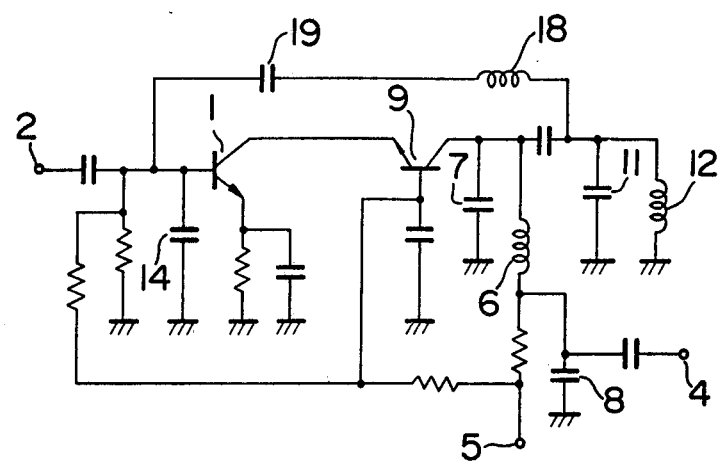
FIG. 5 is a circuit diagram showing a third embodiment of the self-oscillation mixer circuit according to the invention.

In the case of the self-oscillation mixer circuit shown in FIGS. 3 and 4, the feedback path is provided to the emitter of the first transistor in order to produce the local oscillation. However, other circuit configurations may be adopted to the same effect. FIG. 5 shows another embodiment of the self-oscillation mixer circuit according to the invention. In this figure, the circuit components or elements corresponding to those of the circuits shown in FIGS. 3 and 4 are designated by the like reference numerals.

Referring to FIG. 5, the local oscillation is produced and sustained by feeding back the local oscillation frequency component to the base of the first transistor through a feedback path incuding a feedback coil 18 and a D.C. component blocking capacitor 19 connected in series. The local oscillation as well as the mixing operation of the circuit shown in FIG. 5 is effected in a similar manner as the mixer circuit shown in FIG. 3 except that the local oscillation will become more difficult to take place as the frequency becomes higher, since the feedback quantity through the coil 18 is then reduced. On the contrary, the local oscillation tends to occur more readily as the frequency becomes lower and there is a possibility of an abnormal oscillation taking place at a frequency which is extremely lower than the desired local oscillation frequency. Accordingly, difficulty will be encountered in determining the circuit constants required for attaining the desired local oscillation. However, when a narrow or restricted frequency range is tolerated, the local oscillation as well as the mixing operation can be effected with good performance characteristics. In the case of the self-oscillation mixer circuits shown in FIGS. 3, 4 and 5, the circuit elements for determining the local oscillation frequency of the resonance circuit are provided separately from the circuit elements for the feedback path. However, the mixer circuit can be also realized in such circuit configuration in which a common circuit element is so connected as to serve for both the resonant oscillation and the feedback function.

Figure 6:
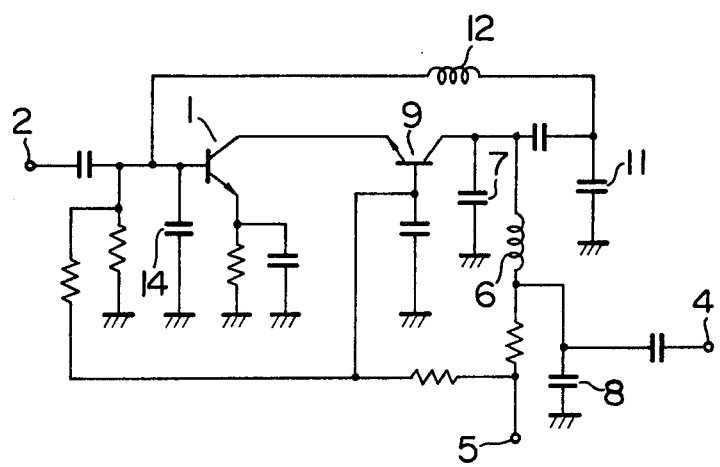
FIG. 6 is a circuit diagram showing a fourth embodiment of the invention.

A fourth exemplary embodiment of the self-oscillation mixer circuit according to the invention is shown in FIG. 6 wherein the circuit components corresponding to those of the circuits described above are designated by the like reference numerals. The resonance capacitor for determining the local oscillation frequency is denoted by numeral 11, while 12 designates a coil which is connected to function as the resonance coil and at the same time as the feedback coil, thus providing the possibility of the number of circuit elements being decreased. In contrast to the circuit shown in FIG. 5, the inductance of the coil 12 is essentially determined by the desired oscillation frequency and cannot be selected at an arbitrary value. In general, the inductance of the coil 12 has to be smaller than that of the feedback coil 18 of the mixer circuit shown in FIG. 5. Consequently, the abnormal oscillation described above in conjunction with the circuit of FIG. 5 will disadvantageously more likely to occur than the latter, which makes the determination of circuit parameters for the desired oscillation more difficult. Further, due to the series connection of the coil 12 and the resonance capacitor 11 coupled to the high frequency signal input terminal 2, the high frequency signal supplied to the input terminal 2 will undergo attenuation to lower the conversion gain when the local oscillation frequency is close to that of the input high frequency signal. It will be nevertheless noted that the mixer circuit shown in FIG. 6 can be effectively operated in a relatively narrow frequency range in which the local oscillation frequency is separated from the frequency of the input high frequency signal and besides implemented inexpensively.

Figure 7:
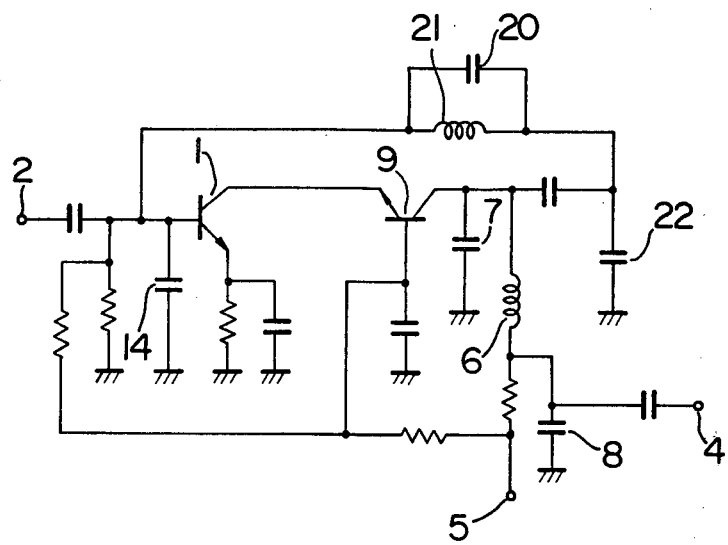
FIG. 7 is a circuit diagram showing a fifth embodiment of the invention.

FIG. 7 shows a fifth embodiment of the mixer circuit according to the invention which differs from the circuit shown in FIG. 6 only in that the coil 12 of the latter circuit is replaced by a parallel resonance circuit with a view to eliminating the disadvantage of the conversion gain being lowered. In FIG. 7, reference numerals 20 and 21 denote, respectively, a capacitor and a coil which serve to determine the resonance frequency and at the same time constitute the feedback circuit. Numeral 22 designates a capacitor which takes part in determining the oscillation frequency but has a lower capacitance value than the resonance capacitor 11 shown in FIG. 5. Consequently, the oscillation frequency of the circuit shown in FIG. 7 corresponds substantially to the frequency of the parallel resonance as determined by the capacitor 20 and the coil 21. Thus, the impedance of the feedback path of the high frequency signal appearing at the input terminal is relatively high, thereby to prevent the conversion gain from being remarkably lowered.

Figure 8:
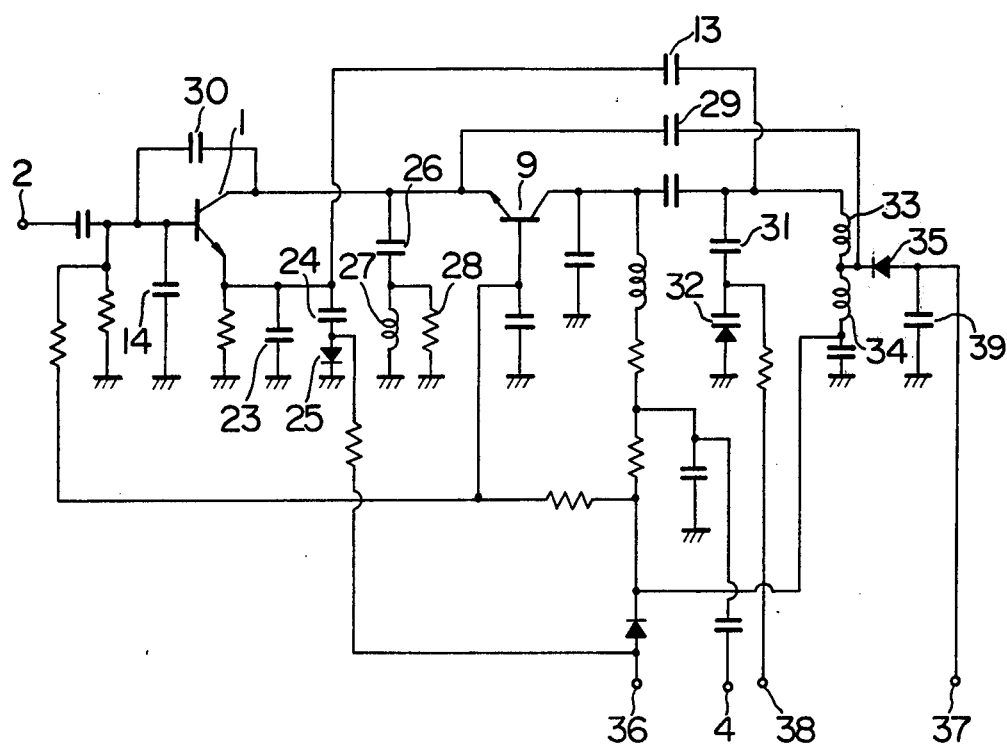
FIG. 8 is a circuit diagram showing a sixth embodiment of the invention in which the self-oscillation mixer circuit is applied to a VHF tuner of a television receiver.

FIG. 8 shows an exemplary embodiment of a VHF tuner of a television receiver to which a self-oscillation mixer circuit according to the invention is applied. Reference numerals 23 and 24 denote capacitors which are connected to the emitter of the first transistor 1. The capacitor 23 is directly grounded, while the capacitor 24 is grounded through a switching diode 25 which serves to change over the capacitor 24 thereby to control properly the feedback quantity for the reception modes at low and high frequency bands. A capacitor 26 connected to the collector of the first transistor 1 serves to block D.C. component and is grounded through a parallel connection of a coil 27 for improving the intermodulation interference characteristic and a damping resistor 28 for the coil 27. Auxiliary capacitors 29 and 30 are connected between the input and the output sides of the second and first transistors 9 and 1, respectively. Numeral 31 denotes a tracking correction capacitor which also serves to block D.C. component, 32 denotes a tuning diode of a variable capacitance for varying the local oscillation frequency, 33 denotes a coil for generating oscillation at the high frequency band reception mode, 34 denotes a coil for generating oscillation at the low frequency band reception mode, 35 denotes a switching diode for changing over the frequency bands of oscillations, 36 denotes a power supply terminal for supplying a source voltage at the low frequency band reception mode, 37 denotes a power supply terminal for supplying a source voltage at the high frequency band reception mode, and numeral 38 denotes a tuning voltage terminal.

At the low frequency band reception mode, a source voltage is applied at the terminal 36, while no voltage is applied to the terminal 37. Under the conditions, the switching diode 35 is in the off or non-conductive state, whereby the tuning coils 33 and 34 are connected in series to each other and constitute a parallel resonance circuit in cooperation with the diode 32 of variable capacitance and the tracking correction capacitor 31, which circuit thus resonates at a local oscillation frequency corresponding to the low frequency band. Since the switching diode 25 is turned on or in the conducting state, the parallel connection of the capacitors 23 and 24 is coupled to the emitter of the first transistor 1 thereby to set the feedback quantity or ratio through the feedback capacitor 13 at a value compatible with the oscillation frequency for the low frequency band reception mode and at the same time increase the capacitance of the emitter grounding path of the first transistor 1 thereby to lower impedance of the emitter grounding path for the high frequencies of the low band. Thus, the conversion gain is prevented from being lowered.

On the other hand, a source voltage is applied to the terminal 37 with no voltage of the terminal 36 in the high frequency band reception mode. Consequently, the switching diode 35 is turned on, whereby the tuning coil 34 is short-circuited. Then, a parallel resonance circuit is constituted by the tuning coil 33, diode 32 of variable capacitance and the tracking correction capacitor 31 and resonates at a local oscillation frequency corresponding to the high frequency band.

Since the switching diode 25 is turned off at the high frequency band reception mode, only the capacitor 23 is coupled to the emitter of the first transistor 1 thereby to set the feedback quantity through the feedback capacitor 13 at a value compatible with the local oscillation frequency at the high frequency band reception mode. Although the capacitance of the emitter grounding path of the first transistor 1 is decreased as compared with that of the low frequency band reception mode, the conversion gain will be scarcely lowered, because the input signal is at a higher frequency.

In this manner, with the circuit configuration shown in FIG. 8, different local oscillation outputs corresponding to the low and high frequency bands can be obtained, whereby application of high frequency signals at the input terminal 2 will result in a predetermined intermediate frequency signal at the output terminal 4.

Next, description will be made on the action of the coil 27 in the circuit shown in FIG. 8. It has been described that the intermodulation interference charactersitic can be improved by connecting a capacitor 26 between the ground and a junction of the first and second transistors 1 and 9. However, an increased capacitance of this capacitor will make difficult the local oscillation in the self-oscillation mixer circuit according to the invention. In order to eliminate such difficulty, the invention teaches that the coil 27 be connected in series to the capacitor 26.

Figure 9:
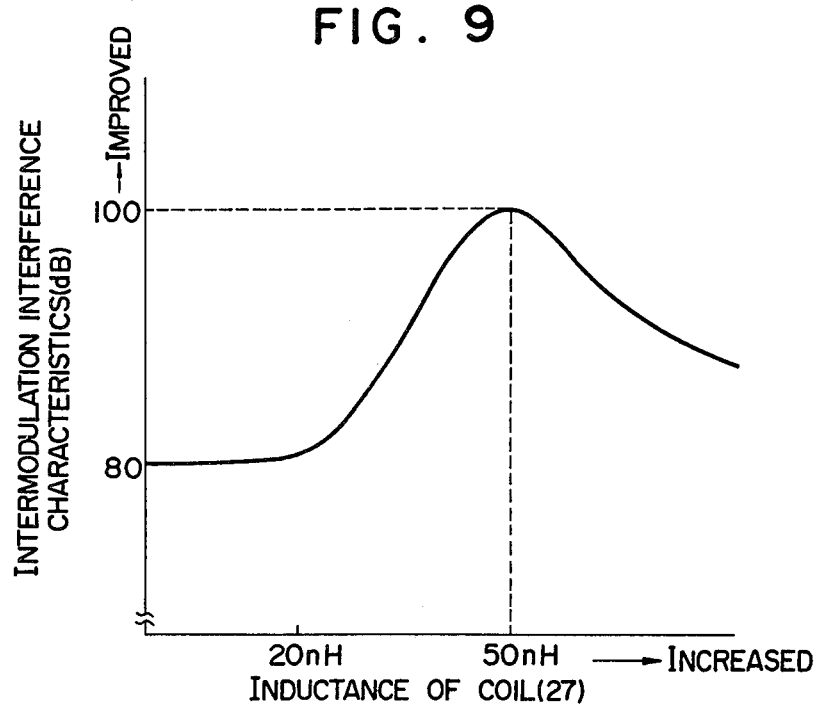
FIG. 9 is a graph to illustrate variation of the intermodulation interference characteristic as a function of inductance of a coil used in the mixer circuit shown in FIG. 8.

The effect attained due to the addition of the coil 27 is graphically illustrated in FIG. 9 in which inductance value of the coil 27 is taken along the abscissa while improvement of the intermodulation interference characteristic is taken along the ordinate. It is to be mentioned that the results illustrated in FIG. 9 have been experimentally obtained through measurement at the second channel of the television broadcasting in U.S.A under the conditions that the capacitance of the capacitor 26 is selected at 2200 pF with the resistor 28 being omitted. It will be seen from FIG. 9 that the intermodulation interference characteristic can be significantly improved with a stable local oscillation attained simultaneously by selecting the inductance of the coil 27 at a specific value. The resistor 28 serves merely to smooth the impedance of the coil 27 over a wide frequency range and is not always necessitated.

Figure 10:
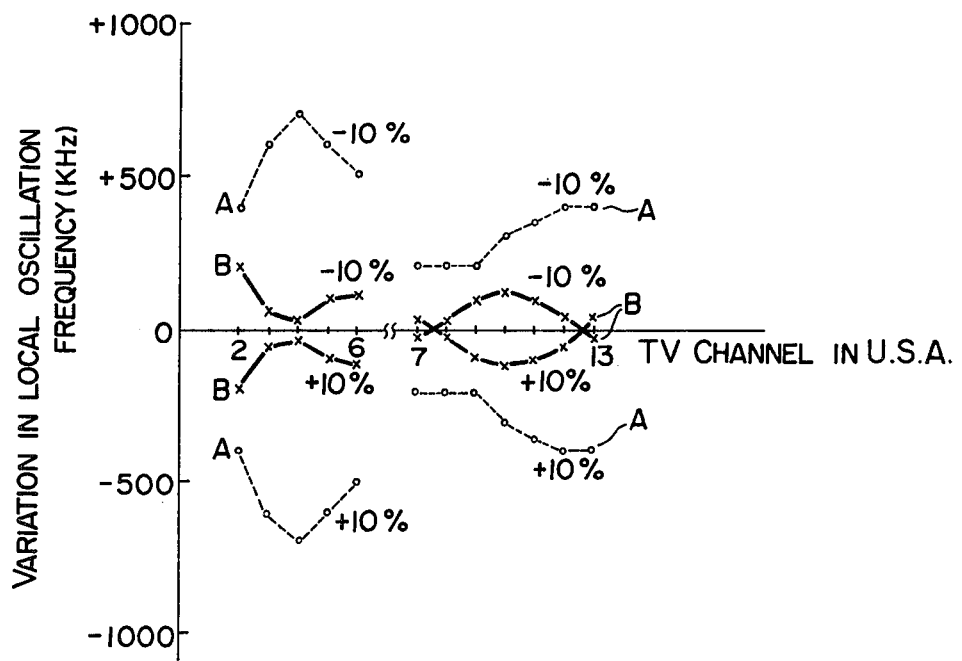
FIG. 10 is a characteristic diagram to illustrate improvement in stability of a local oscillation frequency due to the use of an auxiliary feedback capacitor in the circuit shown in FIG. 8.

The capacitor 29 is effective for improving the stability of the local oscillation frequency against variations in the source voltage. As described hereinbefore, the diode 35 is turned on at the high frequency band reception mode, as a result of which the junction between the tuning coils 33 and 34 is grounded through the switching diode 35 and the bypass capacitor 39. However, due to a lead inductance provided by the switching diode 35 and the bypass capacitor 39, the feedback to the emitter of the second transistor 9 is maintained through the feedback capacitor 29. In other words, the feedback capacitor 29 is effective at both the low and high frequency band reception modes to reduce variation in the output impedance of the second transistor 9, thereby stabilizing the local oscillation frequency independently from variation in the source voltage. Such operation of the capacitor 29 is illustrated in FIG. 10 which graphically shows variation in the local oscillation frequency for variation of ±10% in the source voltage. In this figure, frequency is scaled along the abscissa, while the variation in the local oscillation frequency is taken along the ordinate. The value of the capacitor 29 has been selected at 2 pF. As can be seen from this graphical representation, the capacitor 29 is effective to reduce the variation in the local oscillation frequency to about one half of the variation occurring when the capacitor 29 is absent. Compare the curve B representing the variation at the presence of the capacitor 29 with the curve A at the absence of the capacitor 29.

Figure 11:
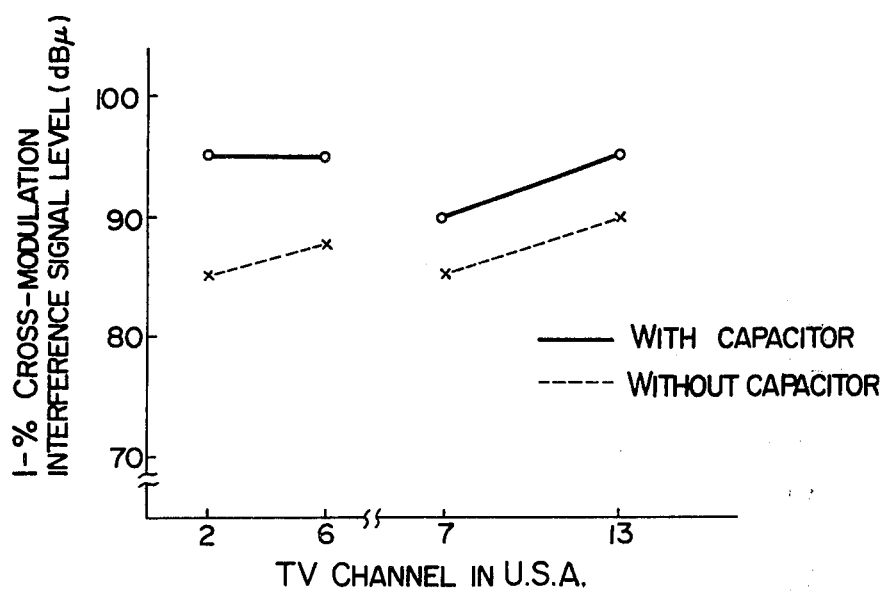
FIG. 11 is a characteristic diagram to illustrate an improvement in the cross-modulation interference characteristic, which may be attained by using an auxiliary feedback capacitor in the circuit of FIG. 8.

On the other hand, the capacitor 30 is effective primarily for improving the cross-modulation interference characteristic. FIG. 11 illustrates graphically 1% cross-modulation interference characteristic with the 1% cross-modulation interference signal level taken along the ordinate, while the frequency (TV channel in U.S.A) is taken along the abscissa. The value of the capacitor 30 has been selected at 2 pF. It can be seen that the provision of the capacitor 30 is effective for significantly improving the characteristic particularly in a low frequency band.

In the foregoing description, it has been assumed that the transistors are of NPN type. However, it will be appreciated that the invention can be implemented with the PNP-transistors or combination of NPN- and PNP-transistors. In the case of the illustrated embodiments of the self-oscillation mixer circuit, the first and second transistors are D.C. coupled to each other. It is, however, obvious that these transistors may be disconnected from each other in the terms of D.C. voltage and applied separately with respective D.C. bias voltages. Although the collector currents of the first and second transistors are set so as to be substantially equal to each other, it is possible to design the associated bias circuits so that the collector current at one transistor differs from the collector current of the other.

It will be appreciated from the foregoing description that the cross-modulation interference characteristic as well as the intermodulation interference characteristic can be significantly improved by the self-oscillation mixer circuit according to the invention in which one transistor in a common emitter connection is combined with the other transistor in a common base connection in a cascade circuit configuration. Additionally, the transistor for local oscillation and the bias circuit therefor as required in the hitherto known separate oscillation mixer circuit including the cascade circuit can be spared in the self-oscillation mixer circuit according to the invention in which the mixing transistor is adapted to effect the local oscillation. It has been found that the interferences described above can be improved more than 10 dB as compared with the hitherto known self-oscillation mixer circuit and additionally the conversion gain can be increased more than 10 dB according to the invention. Besides, the self-oscillation mixer circuit according to the invention can be realized with a remarkably decreased number of the circuit components at correspondingly reduced manufacturing costs.

We claim:

1. A self-oscillation mixer circuit comprising:
   (a) a cascade amplifier circuitry including a first transistor of a common emitter connection and a second transistor of a common base connection having the emitter connected in cascade to the collector of said first transistor, said cascade amplifier circuit having an input circuitry including the base and the emitter of said first transistor, (b) means for supplying a high frequency signal to be converted in frequency to said input circuitry, (c) means connected to the collector of said second transistor for deriving an intermediate frequency signal produced through frequency conversion of said high frequency input signal, (d) a resonance circuitry coupled to the collector of said second transistor for determining a local oscillation frequency, and (e) feedback means connected between said input circuitry and said resonance circuitry to feedback the output from said resonance circuitry to said input circuitry.

2. A self-oscillation mixer circuit as set fourth in claim 1, wherein said feedback means comprises a capacitive element.

3. A self-oscillation mixer circuit as set forth in claim 2, wherein said feedback means is connected between said resonance circuitry and the emitter of said first transistor.

4. A self-oscillation mixer circuit as set forth in claim 3, further including a capacitive element connected between the emitter of said first transistor and the ground and means for varying capacitance of said capacitor in dependence on a frequency band to be processed.

5. A self-oscillation mixer circuit as set forth in claim 1, further including a trap circuitry connected between the base and the emitter of said first transistor.

6. A self-oscillation mixer circuit as set forth in claim 1, wherein said feedback means comprises a series connection of a capacitive element and an inductive element.

7. A self-oscillation mixer circuit as set forth in claim 1, wherein said feedback means is coupled between said resonance circuitry and the base of said first transistor.

8. A self-oscillation mixer circuit as set forth in claim 1, wherein a capacitive element is connected between the collector and the base of said first transistor.

9. A self-oscillation mixer circuit as set forth in claim 1, including a series connection of a capacitive element and an inductive element coupled between the ground and a junction between the collector of said first transistor and the emitter of said second transistor.

10. A self-oscillation mixer circuit as set forth in claim 1, further including a coupling capacitor having one end connected to the collector of said second transistor and said resonance circuitry.

11. A self-oscillation mixer circuit as set forth in claim 10, wherein the other end connected to said feedback means includes an inductive element connected in series to said coupling capacitor, said inductive element being connected between the base of said first transistor and the other end of said coupling capacitor, and wherein said resonance circuitry includes a capacitive element having one end connected in series to said coupling capacitor and the other end grounded, said capacitive element constituting said resonance circuitry in cooperation with said inductive element.

12. A self-oscillation mixer circuit as set forth in claim 10, wherein said feedback means includes a parallel connection of an inductive element and a first capacitive element coupled between the base of said first transistor and the other end of said coupling capacitor, and wherein said resonance circuitry includes a second capacitive element connected between the other end of said coupling capacitor and the ground, said second capacitive element cooperating with said parallel connection to constitute said resonance circuitry.

13. A self-oscillation mixer circuit as set forth in claim 10, wherein said resonance circuitry includes a series connection of first and second inductive elements and a first capacitive element inserted between the other end of said coupling capacitor and the ground, further including a second capacitive element connected between the emitter of said second transistor and a junction between said first and second inductive elements.

* * * * *